United States Patent [19]

Schoon

[11] 4,242,565
[45] Dec. 30, 1980

[54] THERMAL PRINT HEAD
[75] Inventor: David J. Schoon, Marine, Minn.
[73] Assignee: Minnesota Mining and Manufacturing Company, Saint Paul, Minn.
[21] Appl. No.: 45,821
[22] Filed: Jun. 5, 1979
[51] Int. Cl.³ .............................................. H05B 1/00
[52] U.S. Cl. ................................. 219/216; 101/93.04; 219/543; 346/76 PH
[58] Field of Search ............. 219/216, 543; 346/76 R, 346/76 PH, 78; 338/287, 308; 101/93.04; 23/56

[56] References Cited
U.S. PATENT DOCUMENTS

| | | | |
|---|---|---|---|
| 3,161,457 | 12/1964 | Schroeder et al. | 346/76 PH |
| 3,354,817 | 11/1967 | Sakurai et al. | 101/93.04 |
| 3,578,946 | 5/1971 | Collelo | 219/216 |
| 4,035,607 | 7/1977 | Wu | 219/216 |
| 4,096,510 | 6/1978 | Arai et al. | 23/56 |
| 4,123,647 | 10/1978 | Oda | 219/216 |
| 4,136,274 | 1/1979 | Shibata et al. | 219/216 |
| 4,138,605 | 2/1979 | Stapleton et al. | 219/216 |

FOREIGN PATENT DOCUMENTS

| | | | |
|---|---|---|---|
| 1549666 | 11/1968 | France | 219/216 |
| 2000727 | 9/1969 | France | 219/216 |

*Primary Examiner*—Volodymyr Y. Mayewsky
*Attorney, Agent, or Firm*—Cruzan Alexander; Donald M. Sell; Robert L. Marben

[57] ABSTRACT

A thermal print head with a plurality of spaced-apart electrical conductors carried by a support with a surface area provided at an end portion of each conductor. A common electrical conductor is provided having a thin portion for each surface area which is spaced from and essentially parallel to the surface area with resistive material disposed between the common electrical conductor and each of the surface areas. The print head provides a path for current flow and thermal flow through the resistive material in a direction essentially perpendicular to the surface areas.

11 Claims, 4 Drawing Figures

THERMAL PRINT HEAD

BACKGROUND OF THE INVENTION

The invention presented herein relates to thermal print heads.

Thermal print heads representative of the prior art thermal print head structures use a ceramic substrate that is covered with a glaze on which a number of metallic conductors are deposited and usually arranged as individual heater traces with one or more of the conductors provided as common conductor traces. A resistive material is coated on the glaze and extends between the end portions of the heater traces and the common conductor(s). An electrically insulating, wear resistant layer is usually coated over the resistive material to provide a smooth, wear resistant surface which is contacted by thermally sensitive paper that is moved relative to the surface during operation. During operation, voltage pulses are selectively applied to the heater traces and the common conductor(s) causing current flow through a portion of the resistive layers generating heat. Heat diffuses through the wear resistant layer to cause an imaging reaction to occur at thermally sensitive paper presented to the layer. Considering a single heater of a print head of this representative prior art configuration, the direction of heat flow toward the paper is perpendicular to the direction of the electrical current flow through the resistive material making up the body of the heater. It is also noted that the percentage of surface contact made between a heater conductor trace and the body of the heater is small compared to the total surface area of the heater.

U.S. patents representative of the prior art thermal print head structures include U.S. Pat. No. 3,161,457—H. Schroeder et al; U.S. Pat. No. 3,354,817—R. S. Sakurai et al; U.S. Pat. No. 3,578,946—W. L. Colello; U.S. Pat. No. 4,096,510—Arai et al; U.S. Pat. No. 4,136,274—Shibata et al; and U.S. Pat. No. 4,138,605—Stapleton et al.

Wear resistant material, when used in prior art print head structures, must be electrically insulating or it will electrically short circuit the heater. Being electrically insulating, the wear resistant material does not provide thermal conduction to the degree that can be provided by a metal. Reduction of the thickness of the wear resistant layer to improve its thermal conduction reduces the lifetime of the head. Response time and energy efficiency are impaired if the wear resistant layer is made thick enough to provide adequate wear lifetime.

A study of prior art thermal print head structures showed the need for a thermal print head that has a rapid response, making it possible to print a given amount of information in a shorter period of time than is possible with presently known thermal print heads. The study also indicated the need to provide higher resolution than is economically feasible with existing prior art teachings to increase the quality of a thermally produced image. A thermal print head which would operate with significantly less energy than is required by presently known print heads was also seen to be desirable, since it would reduce the cost of the drive circuitry used with a thermal print head. A reduction in the energy required was also recognized as a means for providing savings in the heat sink arrangements that are used with a thermal print head. Need was also seen for a thermal print head that is more resistant to wear and abrasion by various thermally responsive sheet materials that may be used with thermal print heads to provide a thermal print head with a longer useful life. It was desirable that the foregoing needs be achieved by a thermal print head having a construction cost that is significantly lower than is possible using presently known structural arrangements.

SUMMARY OF THE INVENTION

The foregoing deficiencies in prior art thermal print heads are remedied by the thermal print head embodying the present invention which includes a plurality of spaced apart electrical conductors carried by a support structure, each conductor having a terminated end portion, each end portion having a surface area, the support structure presenting a surface portion adjacent and essentially parallel to each of the surface areas. A common electrical conductor is provided having a thin portion spaced from and essentially parallel to and opposite the surface areas of the electrical conductors. Resistive material extends between and in electrical contact with the common electrical conductor and each of the surface areas of the plurality of electrical conductors. With this arrangement, application of an electrical voltage between any one of the plurality of electrical conductors and the common electrical conductor causes current to flow via the resistive material to create thermal energy. The current flows between the surface area of the conductor to which the voltage is applied and the common electrical conductor. The path of flow of current and most of the thermal energy generated is along a path essentially perpendicular to the surface area provided by the common electrical conductor. In operation, thermally sensitive paper is moved relative to the common electrical conductor to receive any thermal energy present at areas of the common electrical conductor opposite the surface areas presented by the one end of each of the plurality of electrical conductors.

It is preferred that the common electrical conductor be a metallic material, since it will provide both high electrical conductivity and high thermal conductivity. In addition, a metallic material provides a very good resistance to wear. Due to the excellent quality of the thermal coupling between common electrical conductor and the thermally sensitive paper that is moved relative to the common electrical conductor, the temperatures generated in the resistive materials can be lower than that required by the prior art structures. This makes many materials suitable for use as the resistive materials that would not otherwise be acceptable.

Since the contact area between the resistive material and the electrical conductors is large and the thermal gradient is lowest at the areas of the resistive material in contact with the conductors, the resistive material is less susceptible to fissuring and can, therefore, withstand electrical pulses of higher power than can be used with prior art thermal print heads allowing the pulses to be shorter in duration.

The good thermal coupling and operation at short pulse times serves to reduce the amount of residual heat that is lost to the support member which, in turn, means a reduction in the "cool down" time required for a heater and surrounding material to drop below the temperature at which the thermal sensitive paper responds allowing a thermal print head according to this invention to operate at faster repetition rates.

Since the energy input required per heater is lower, the cost of the associated electronics is reduced. The low duty cycle of each heater also allows the heaters to be multiplexed with a large number of other heaters for each driver providing further savings in the cost of associated electronics.

A thermal print head in accordance with this invention allows the edge portion of the common electrical conductor in the direction of the paper movement to be sloped away from contact with the paper immediately adjacent the heaters, which cannot be readily accomplished in structures according to the prior art teachings.

The surface area presented by the end of a conductor adjacent the resistive material for each heater primarily determines the size and shape of the heater so a large number of heaters can be provided per unit distance and various heater shapes can be manufactured at low cost.

The plurality of electrical conductors in the structure of this invention can be arranged so "wells" are provided with the end surface of conductors providing the bottom for the wells. The resistive material is received in the "wells" reducing electric current flow between adjacent heaters and serving to reduce the possibility of fissuring.

BRIEF DESCRIPTION OF THE DRAWINGS

The foregoing features and advantages, as well as others, provided by the present invention will be appreciated and become better understood by the following description and drawings, in which.

DETAILED DESCRIPTION

Figure 1:
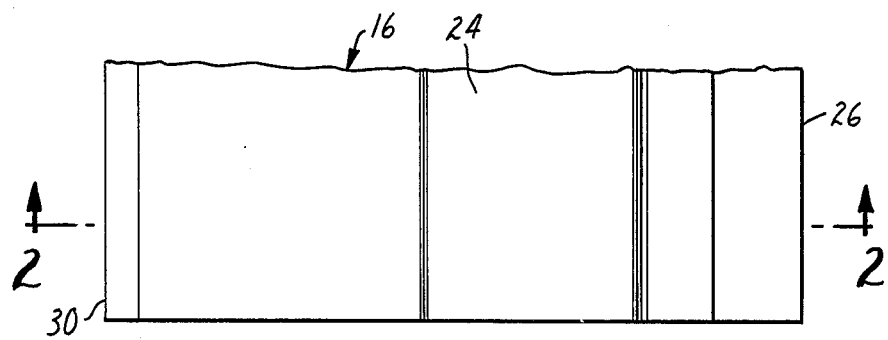
FIG. 1 is a top view of a portion of a thermal print head embodying the invention.
Figure 2:
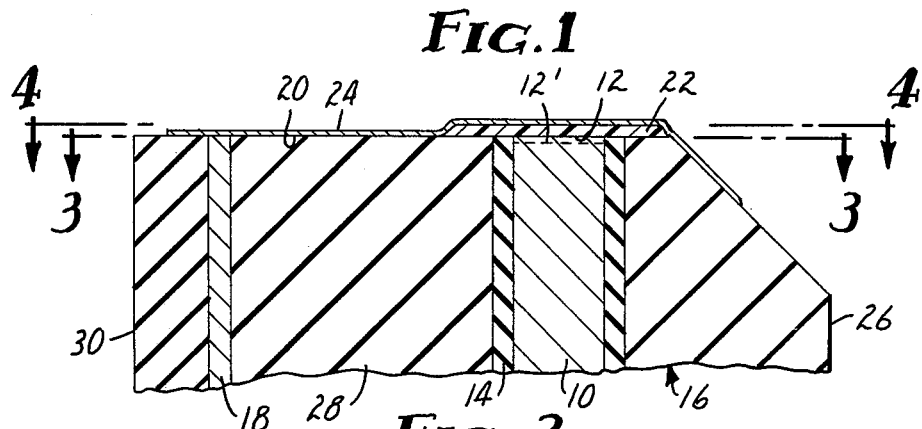
FIG. 2 is a sectional view of a portion of the thermal print head of FIG. 1 taken along the line 2—2 of FIG. 1.
Figure 3:
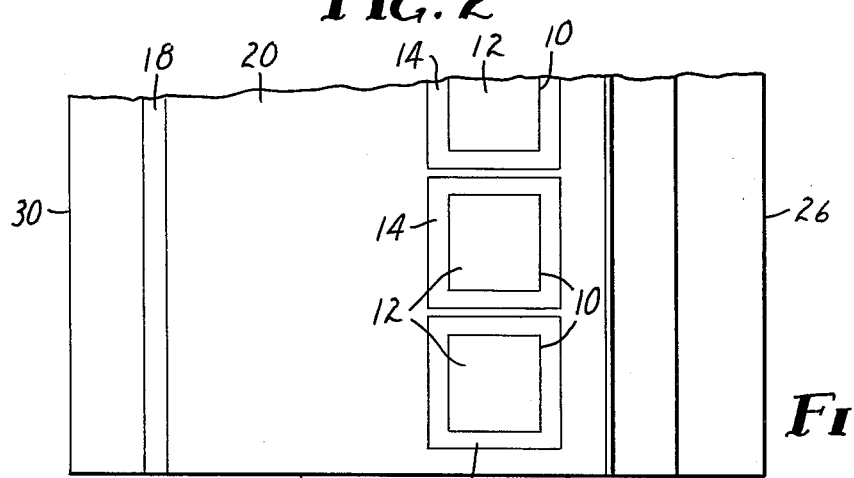
FIG. 3 is a sectional view of the thermal print head of FIG. 1 taken along the line 3—3 of FIG. 2.
Figure 4:
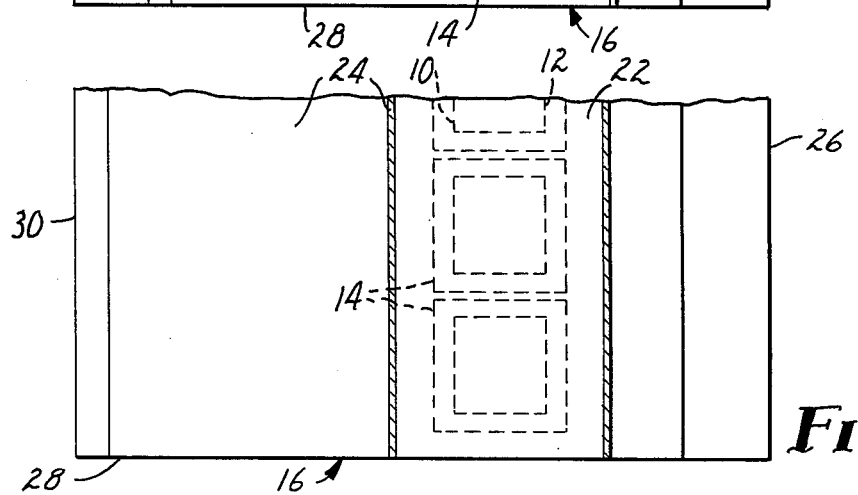
FIG. 4 is a sectional view similar to FIG. 4, but taken along the line 4—4 of FIG. 2.

Referring to FIGS. 2 and 3 of the drawings, a thermal print head is shown embodying the present invention. It includes a plurality of conductors 10 which are located apart from one another in a linear array with a surface area 12 provided at an end portion of each of the conductors, as shown in FIG. 2. In the structure shown, the end surface of each conductor provides the surface area 12. Each of the conductors 10 are shown with a surrounding separate layer of insulation 14, which, in the structure shown, may be provided by using enamel coated wire. The presence of a separate layer of insulation 14 on the conductors 10 is not essential to the structure of the print head, but its presence makes it easier during manufacture to position the conductors apart from one another. The conductors 10 are carried by a support structure 16 formed of insulating material which also carries a common conductor 18. The support structure 16 is provided with a surface 20 which is located essentially parallel to and adjacent the surface area 12 of each of the conductors 10. While a plane surface 20 is shown, the surface 20 can also be curved. While the thermal print head of this embodiment shows the surface areas 12 contiguous to the surface 20, the surface areas 12 can be recessed slightly to provide the bottom of small "wells" such as indicated by the line 12'. A thin layer of resistive material 22 is positioned so as to establish electrical contact with the entire area presented to each of the surface areas 12 and may, as shown, extend a short distance in contact with the surface 20 adjacent each surface area 12. The thickness of the layer 22 is much less than any dimension of the surface area 12. It is desirable that it present a uniform thickness over the surface areas 12 and thereby provide an outer surface portion that is essentially parallel to the surface areas 12. A thin layer 24 of metallic material is placed in electrical contact with the resistive material 22 and extends along the plane surface 20 to the common conductor 18 where it joins with the common conductor 18 to make electrical contact with the conductor 18. The resistive material 22 between the metallic layer 24 and a surface area 12 of a conductor 10 provides a single heater so a plurality of heaters are provided, one for each conductor 10.

Thermal print heads are used to provide heat generated images on thermally sensitive paper. In the case of the thermal print head described, the thermally sensitive paper moves to the right relative to the drawings and is positioned to make good contact with the metallic layer 24 at the portion directly opposite each of the surface areas 12 of the conductors 10. Short duration electrical voltage signal pulses are selectively applied between the common conductor 18 and a conductor 10. Images are generated at the thermally sensitive paper in response to thermal energy produced by pulses of current resulting from such signals which pass through the associated heater provided by the resisitive material 22 at each of the conductors 10. The current path for any one heater includes a conductor 10, resistive material 22, metallic layer 24 and the common conductor 18. Current for any one heater, it should be noted, flows through the resistive material 22 in a direction that is essentially perpendicular to the surface area 12 with most of the thermal energy generated in the resistive material flowing in the same direction to the thermal paper via the metal layer 24.

Even when the surface 20 presents a plane surface, the thermal print head structure described allows the surface of the support structure 16 to be sloped at a point adjacent to or near the edge of the resistive material from which imaged portions of thermally sensitive paper used with the head moves relative to the thermal print head. Such sloping of the support structure 16 is shown in FIG. 2. Since some thermally sensitive papers may react to thermal energy to produce images that can smear, sloping of the support structure 16, as described and shown in FIG. 2, prevents or reduces any smearing of the thermally produced images.

A thermal print head can be made in accordance with this invention and can be made by winding 36 gauge enamel coated copper wire in a single layer on a mandrel at a spacing of 6.3 per millimeter for a distance of 203 millimeters. The winding is then coated with a material such as varnish which is allowed to dry. The winding is then cut lengthwise of the mandrel and the assembly of wires are removed from the mandrel and straightened out. A portion of the assembly of wires, which provide conductors, correspond to the conductors 10 of the drawing, is sandwiched along its entire length between two pieces of insulation corresponding to parts identified in the drawings by reference numerals 26 and 28. The piece of insulation 26 may be a glass epoxy sheet 1.6 millimeters thick with the piece of insulation 28 identical, except for a thin layer of copper laminated to the side of the sheet away from the wires.

Thus, the insulating piece 28 with the copper layer can be a piece of unetched printed circuit board material. The copper layer provides the common conductor 18. The common conductor 18 is covered at an end portion by a thin insulating piece 30 which serves only to protect the conductor 18 from making any unwanted contact with another conductive part when used in an apparatus. The assembly is held together with an epoxy adhesive. Once the epoxy has cured, the assembly is cut smooth along one edge to expose the ends of the wires. An area about 2 millimeter wide and 205 millimeters long, centered about the array of wires 10, is coated with a suitable resistive material, such as polymeric thick film resistive material available from Methode Development Company, Chicago, Illinois. The resistive material is coated to a thickness of 0.04 millimeter and is then heat cured. Resistive material that measures 1000 ohms per square is suitable. The resistive material is available over a wide range. The resistive material selected is, of course, dependent on the electronics to be used in supplying the current flow to generate the temperature needed. The end of the assembly on which the resistive material is coated is then vapor coated with 0.005 millimeter chrome. The copper wires 10, which extend from the opposite end of the assembly, are available along with the common conductor 18 for connection to appropriate drive electronics.

A thermal print head can be made as described above, except that the vapor coated chrome is scored across the assembly every 64th wire with the copper layer 18 segmented to provide a common conductor for every 64 wires. This allows the head to be operated with 64 pull-down drivers and a pull-up driver for each set of 64 wires to provide a relatively inexpensive drive electronics arrangement for use with the thermal print head.

Since the size and shape of the heaters is controlled primarily by the size and shape of the surface area 12 provided by the conductors 10 and not by coating methods or etching procedures, a large number of heaters per unit distance or various heater shapes can be manufactured at low cost.

It is apparent that many variations can be made within the teachings of this invention. For example, the conductors 10 can be provided by uninsulated wire or can be printed circuit board traces. A wide range of materials can be used for the resistive material 22 including doped semiconductor material, a carbon (graphite) based material, conductive iron oxide, conductive zinc oxide, any of various metal particles dispersed in a binder or fired material such as ruthenium oxide. The conductors 10 can be positioned in a linear array as shown in the drawings or positioned to provide a two-dimensional configuration. The metallic material used for the layer 24 can be vapor coated, as in the foregoing example, sputtered or can be a metallic foil or other type of electrically conductive material. Any electrically conductive material that provides good resistance to wear is suitable for the layer 24.

There are two direct advantages, relative to that of the prior art, conferred by the arrangement of this invention: (1) the thermal resistance between the heater 22 and the paper used with the thermal print head is lower than is possible by the prior art, and (2) the heater 22 is resistant to damage by higher energy pulses which can thus be of shorter duration. The fact that the thermal resistance between heater 22 and the paper is lower than is possible with the prior art can be understood better by considering the potential substances that can be used for the layer 24 that separates the heater 22 from the paper. The layer 24, according to this invention, functions as a wear resistant layer, as a common electrical conductor, and as a thermal conductor. It is typically a metallic material. Materials that have high electrical conductivity also have high thermal conductivity; conversely if a material has low electrical conductivity (e.g. an insulator) it tends also to have low thermal conductivity. This fact is advantageous in this invention since both high thermal conductivity and high electrical conductivity are desired, and there are a variety of materials (e.g. metals—copper, aluminum, chromium, steel, etc.) that work well. According to the prior art, on the other hand, any wear resistant material must be electrically insulating, or it will short circuit (electrically) the heater of the prior art type. No material is known that is electrically insulating that will work as well as a metal as a thermal conductor. Thus, a compromise must be sought if the prior art structure is used. Either (1) little or no wear resistant layer is provided, and the lifetime of the head is short, or (2) if an adequate wear resistant layer is provided to protect the heater against wear, the thermal coupling between the heater and the paper is poor, and, thus, the response time is slow and the energy efficiency of the system is poor.

To understand why a heater made according to this invention is more resistant to damage under conditions of high pulse energy for short times, consideration must be given to what happens to a heater when a voltage signal is suddenly applied to the heater. Sudden heating of the heater causes a very high thermal gradient to occur within and outside of the heater, and if this thermal gradient is high enough and occurs over many cycles of operation, cracking and fissuring of the resistive material will occur. As a result, the resistance near the contacts with the conductors will rise, resulting in even greater thermal gradients, and eventually resulting in loss of contact between the electrical conductors and the heater. To avoid this in a heater made according to the prior art, the rate of heat generation must be kept within low limits to avoid failure. In a heater made according to this invention, far higher rates of heat generation can be withstood. This is believed to be due to the large contact area that is provided between the heater 22 and the electrical conductors 10 and layer 24 plus the fact that such large contact area is made at surfaces of the heater where the thermal gradient is lower. With a large contact area, a greater number of cracks or fissures can be tolerated before the heater fails. The heaters 22 of this invention and the prior art thermal print heads are thin and so heat flow at the two large surfaces presented by the thin heaters is generally in one direction and provide two large surface areas at which the thermal gradient is lower than the thermal gradient presented at the small, narrow edge surface of such heaters. The narrow edge surfaces of the heater are used for making contact with conductors in the case of the prior art, so high thermal stress, due to the high thermal gradient, is present leading to cracks and fissures. The structure according the present invention has the contacts between the heater and the conductors at the large surfaces with the lower thermal gradient so thermal stress at the contacts between the heater and conductors is less than that presented in prior art structures reducing the tendency towards fissuring of the heater at the contact area. Under such circumstances, a heater according to the present invention allows more fissuring to occur before the heater fails and the heater is less susceptible to fissuring thereby providing a heater that can withstand the use of pulses of higher power, so that it is possible to use the heater with pulses of shorter duration than can be used with the prior art heaters.

A thermal print head embodying the present invention can operate at faster repetition rates than prior art print heads. This is due, in part, to the good thermal coupling between the heater 22 and the paper that is provided by the electrically conductive layer 24. Since this allows the heater to operate at a lower temperature, there is less residual heat present in the heater and its surrounding support structure. The residual heat level is also kept low, since the heater of the present invention can be operated at short pulse times. When the heater is turned on, a "wave" of heat starts traveling into the support structure for the heater. The amount of heat that is wasted depends on the heater temperature and its "on" time. As both quantities become lower, the amount of residual heat that is lost to the substrate becomes lower. Low heat loss to the substrate not only means that, of the total energy input, a greater amount is available to the paper, but it also means that the "cool down" time required for the heater and surrounding substrate to drop below the temperature at which the paper will convert, is lower. Energizing pulses must be spearated by at least the "cool down" time for the print head to operate properly.

Because the energy input required per dot is lower, the cost of the associated electronics that is used to control the energization of the heaters is also lower. The fact that the duty cycle of each heater can be very low means that the heaters can be multiplexed with a large number of other heaters for each driver, further reducing the costs of associated electronics.

In addition to the two direct advantages provided by the thermal print heat of this invention, good thermal coupling between the heater and the paper and the ability of the heater to withstand high power pulses, other advantages follow: lower manufacturing costs for both the thermal print head and the associated electronics; lower energy consumption; and faster speeds of operation.

What is claimed is:

1. A thermal print head including:
   a plurality of spaced-apart electrical conductors each having a terminated end portion, each of said end portions having a surface area;
   an electrically and thermally insulating support structure carrying said electrical conductors, said support structure having a surface portion adjacent each of said surface areas of the electrical conductors;
   a common electrical conductor having a portion for each of said surface areas of the electrical conductors that is spaced from and essentially parallel to said surface areas of the electrical conductors; and
   resistive heating material extending between and in electrical contact with said common electrical conductor and each of said surface areas of the electrical conductors whereby the application of an electrical voltage between any one of said plurality of electrical conductors and said common conductor causes electric current and most of the resulting thermal energy to flow between said surface area of said one of said plurality of electrical conductors and said portion of said common conductor in a direction essentially perpendicular to said surface area and via said resistive material extending therebetween.

2. A thermal print head according to claim 1 wherein said plurality of electrical conductors are insulated wires.

3. A thermal print head according to claim 1 wherein said spaced-apart electrical conductors are enamel coated wires.

4. A thermal print head according to claim 1 wherein each of said terminating end portions have an end surface, said end surface providing said surface area.

5. A thermal print head according to claim 1 wherein said common electrical conductor is formed of a metallic material.

6. A thermal print head according to claim 1 wherein said surface areas provided by said plurality of electrical conductors present a linear array.

7. A thermal print head according to claim 1 wherein any dimension of said surface area is large relative to the distance said portion of said first conductor is spaced from said surface area.

8. A thermal print head according to claim 1 wherein said surface areas and said surface portion are contiguous.

9. A thermal print head according to claim 1 wherein said surface areas are below said surface portion.

10. A thermal print head according to claim 1 wherein said support member includes a printed circuit board substrate and said plurality of electrical conductors are traces formed on said printed circuit board substrate.

11. A thermal print head according to claim 1 wherein said support structure includes a second surface portion that is an extension of said first-mentioned surface portion, said second surface portion disposed away from said first-mentioned surface portion and toward said plurality of electrical conductors.

* * * * *